US010956497B1

(12) United States Patent
Plymale

(10) Patent No.: US 10,956,497 B1
(45) Date of Patent: Mar. 23, 2021

(54) USE OF SCALABLE VECTOR GRAPHICS FORMAT TO ENCAPSULATE BUILDING FLOORPLAN AND METADATA

(71) Applicant: United Services Automobile Association (USAA), San Antonio, TX (US)

(72) Inventor: Jesse Plymale, Dallas, TX (US)

(73) Assignee: United States Automobile Association (USAA), San Antonio, TX (US)

(*) Notice: Subject to any disclaimer, the term of this patent is extended or adjusted under 35 U.S.C. 154(b) by 0 days.

(21) Appl. No.: 16/152,296

(22) Filed: Oct. 4, 2018

Related U.S. Application Data

(60) Provisional application No. 62/568,748, filed on Oct. 5, 2017.

(51) Int. Cl.
| | |
|---|---|
| *G06F 17/50* | (2006.01) |
| *G06Q 10/00* | (2012.01) |
| *G06F 16/838* | (2019.01) |
| *H04W 4/021* | (2018.01) |
| *G06F 3/0486* | (2013.01) |
| *G06F 16/29* | (2019.01) |
| *G06F 16/56* | (2019.01) |
| *G06F 16/58* | (2019.01) |
| *G06F 30/13* | (2020.01) |

(52) U.S. Cl.
CPC .......... *G06F 16/838* (2019.01); *G06F 3/0486* (2013.01); *G06F 16/29* (2019.01); *G06F 16/56* (2019.01); *G06F 16/58* (2019.01); *G06F 30/13* (2020.01); *H04W 4/021* (2013.01)

(58) Field of Classification Search
CPC .. G06F 17/5004; G06F 17/50; G06F 2217/02; G06F 2217/04
See application file for complete search history.

(56) References Cited

U.S. PATENT DOCUMENTS

| | | | |
|---|---|---|---|
| 7,047,180 B1 * | 5/2006 | Mathews | G06F 16/972 703/27 |
| 2004/0113927 A1 * | 6/2004 | Quinn | G09G 5/00 715/700 |
| 2004/0113937 A1 * | 6/2004 | Sawdey | G06F 17/5004 715/738 |
| 2007/0237395 A1 * | 10/2007 | Spencer, Jr. | G06K 9/00476 382/203 |

(Continued)

*Primary Examiner* — Jin Cheng Wang
(74) *Attorney, Agent, or Firm* — Fletcher Yoder P.C.

(57) ABSTRACT

Disclosed herein are embodiments of systems, methods, and products comprises an analytic server, which uses scalable vector graphic (SVG) format to encapsulate building floorplan and metadata. The analytic server creates a floorplan map in SVG format that includes both a graphic map and a specification file. When a user issues an information request by clicking on one graphical element, the analytic server determines the object identifier of the clicked graphical element, queries the specification file to receive metadata about the clicked graphical element based on the object identifier, and renders a user interface to display the metadata about the graphical element. When the user modifies the graphical element, the analytic server determines new data of the graphical element and updates the corresponding object metadata with the new data in the specification file.

20 Claims, 5 Drawing Sheets

(56) References Cited

U.S. PATENT DOCUMENTS

| | | | |
|---|---|---|---|
| 2008/0183483 A1* | 7/2008 | Hart | G06F 17/5004 |
| | | | 705/1.1 |
| 2009/0160856 A1* | 6/2009 | Hoguet | G06Q 10/06 |
| | | | 345/420 |
| 2010/0066559 A1* | 3/2010 | Judelson | G08B 19/005 |
| | | | 340/8.1 |
| 2011/0218777 A1* | 9/2011 | Chen | G06F 17/50 |
| | | | 703/1 |
| 2012/0320058 A1* | 12/2012 | Stephen | G06T 15/20 |
| | | | 345/428 |
| 2013/0080504 A1* | 3/2013 | Maurer | G06T 17/05 |
| | | | 709/203 |
| 2014/0237035 A1* | 8/2014 | Smith | G06F 17/50 |
| | | | 709/203 |
| 2016/0133036 A1* | 5/2016 | Chen | G06Q 10/00 |
| | | | 345/629 |
| 2017/0068419 A1* | 3/2017 | Sundermeyer | G08B 25/008 |
| 2017/0185278 A1* | 6/2017 | Sundermeyer | G08B 13/19682 |
| 2018/0011823 A1* | 1/2018 | Chegini | G06Q 10/10 |
| 2020/0059776 A1* | 2/2020 | Martin | G06F 3/04817 |

* cited by examiner

USE OF SCALABLE VECTOR GRAPHICS FORMAT TO ENCAPSULATE BUILDING FLOORPLAN AND METADATA

CROSS-REFERENCE TO RELATED APPLICATIONS

This application claims priority to U.S. Provisional Patent Application Ser. No. 62/568,748, entitled "Use of Scalable Vector Graphics Format to Encapsulate Building Floorplan and Metadata," filed Oct. 5, 2017, which is hereby incorporated by reference in its entirety.

TECHNICAL FIELD

This application relates generally to methods and systems for using scalable vector graphics (SVG) format to encapsulate building floorplan and metadata.

BACKGROUND

Large buildings, such as office campuses or shopping malls, can be disorienting and confusing to navigate. This problem is particularly acute when many buildings and floors look the same, which can be troublesome for employees/customers unfamiliar with the buildings. In order to help patrons navigate, some institutions provide floorplans indicating various features and points of interests within a building. However, most building floorplans, used by existing and conventional methods, are stationary and non-interactive, which may be frustrating for users and may create a negative user experience. Even though some existing methods provide navigation applications having interactive floorplans that allow a user to click on different features on the map to obtain more information (e.g., the room number, conference room names, and the like), these conventional methods and solutions have created several technical shortcomings and a new set of technical challenges.

For example, existing methods generally utilize two files to operate and support the navigation application: a visual representation (e.g., map diagram) of the floorplan and a separate metadata file that includes coordinates of each of the locations of the rooms (e.g., using x/y/width/height along with the room number for those coordinates). The navigation application may monitor users' interactions (e.g., mouse clicks on the diagram or floor map) and map the interactions to the coordinate of the given room's metadata. The navigation application may then query the metadata file to display the room number for that room. However, it may be difficult to keep the graphical representation of the floorplan synchronized with the metadata corresponding to each feature displayed on the floorplan. For example, when a user edits the map diagram to change the size of a room (or other features displayed on the map), conventional applications may require the user (or an administrator) to go to a separate metadata file and update the metadata associated with the room to match the edited diagram. Furthermore, if the image of a diagram is resized, the user must separately scale the coordinates to match the new/modified data, which is a tedious and error-prone process. As a result, conventional solutions require updating multiple files, which has been proven to be technically inefficient.

SUMMARY

For the aforementioned reasons, there is a need for an efficient and interactive system to create a floorplan map that may be able to dynamically display metadata alongside the floorplan in response to user's request and allow the user to edit/modify both the graphic map and metadata within a program. Discussed herein are systems and methods for receiving building floorplan data, creating a floorplan map in SVG format to encapsulate building floorplan and metadata, receiving information request from a client device, determining the object identifier of the request, receiving requested data associated with the object identifier by retrieving the SVG specification, and generating user interface to display the requested data. In some embodiments, the system and methods may include receiving a modification request from the client device, determining the object identifier of the modification, determining the new data of the object after modification, and updating the SVG specification with the new object data.

In one embodiment, a method comprises rendering, by a server on a user interface displayed on an electronic client device, a floorplan map in scalable vector graphics format, wherein the floorplan map in scalable vector graphics format comprises a graphic map and a specification file, the graphic map containing a plurality of graphical elements, each graphical element corresponding to an object in the specification file, the specification file including metadata and functions associated with each graphical element; identifying, by the server, from a user with a graphical element within the plurality of graphical elements displayed on the floorplan map, the interaction corresponding to a request to modify the graphical element, wherein the request comprises new metadata corresponding to at least one of a new size, a new shape, a new location, and a new layout of the graphical element; identifying, by the server, an object identifier corresponding to the graphical element; and updating, by the server in real time, metadata associated with the object identifier with the new metadata in the specification file, wherein the server updates the metadata by triggering a modification function associated with the object identifier, the modification function corresponding to the request to modify the graphical element.

In another embodiment, a system comprises an electronic client device; and a server in communication with the electronic client device and configured to: render, on a user interface displayed on the electronic client device, a floorplan map in scalable vector graphics format, wherein the floorplan map in scalable vector graphics format comprises a graphic map and a specification file, the graphic map containing a plurality of graphical elements, each graphical element corresponding to an object in the specification file, the specification file including metadata and functions associated with each graphical element; identify an interaction from a user with a graphical element within the plurality of graphical elements displayed on the floorplan map, the interaction corresponding to a request to modify the graphical element, wherein the request comprises new metadata corresponding to at least one of a new size, a new shape, a new location, and a new layout of the graphical element; identify an object identifier corresponding to the graphical element; and update, in real time, metadata associated with the object identifier with the new metadata in the specification file, wherein the server updates the metadata by triggering a modification function associated with the object identifier, the modification function corresponding to the request to modify the graphical element.

It is to be understood that both the foregoing general description and the following detailed description are exemplary and explanatory and are intended to provide further explanation of the disclosed embodiment and subject matter as claimed.

BRIEF DESCRIPTION OF THE DRAWINGS

The accompanying drawings constitute a part of this specification and illustrate embodiments of the subject matter disclosed herein.

DETAILED DESCRIPTION

Figure 1:
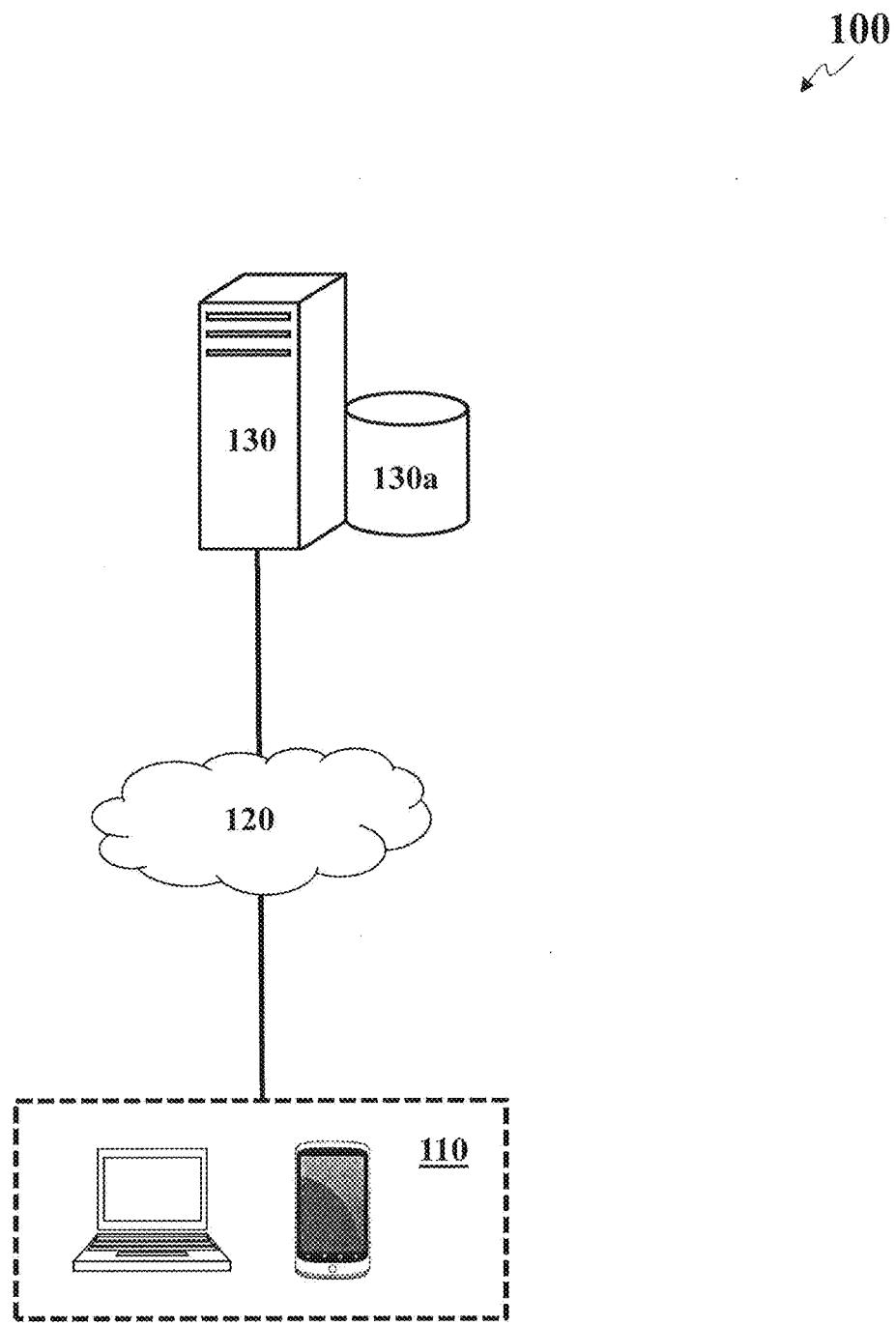
FIG. 1 illustrates a computer system for using SVG format to encapsulate building floorplan and metadata, according to an embodiment.

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are pot meant to be limiting of the subject matter presented here.

FIG. 1 illustrates components of a system 100 for using scalable vector graphics (SVG) format to encapsulate building floorplan and metadata, according to an embodiment. The system 100 may comprise a set of electronic client devices 110, an analytic server 130, and a floorplan database 130a, which are connected with each other via hardware and software components of one or more networks 120 or another network similar but separate and distinct from the network 120. Examples of the network 120 include, but are not limited to, Local Area Network (LAN), Wireless Local Area Network (WLAN), Metropolitan Area Network (MAN), Wide Area Network (WAN), and the Internet. The communication over the network 120 may be performed in accordance with various communication protocols, such as Transmission Control Protocol and Internet Protocol (TCP/IP), User Datagram Protocol (UDP), and IEEE communication protocols.

The electronic client device 110 may be any computing device allowing a participant/user to interact with the analytic server 130. The electronic client device 110 may be any computing device comprising a processor and non-transitory machine-readable storage medium allowing the electronic device 110 to perform the various tasks and processes when interacting with the analytic server 130. Examples of the computing device may include, but are not limited to, a desktop computer, a laptop, a personal digital assistant (PDA), a smartphone, a tablet computer, a smart watch, and the like.

The electronic client device 110 may execute an Internet browser or local application that accesses the analytic server 130 in order to issue requests or instructions. The electronic client device 110 may transmit credentials from client inputs to the analytic server 130, from which the analytic server 130 may authenticate the client and/or determine a client role. The analytic server 130 may access a system database configured to store user credentials, which the analytic server 130 may be configured to reference in order to determine whether a set of credentials (purportedly authenticating the user) match an appropriate set of credentials that identify and authenticate the user. The electronic client device 110 may comprise any number of input devices configured to receive any number of data inputs, including various types of data inputs allowing for authentication (e.g., username, passwords, certificates, and biometrics).

The electronic client device 110 may be configured to communicate with the analytic server 130 through one or more networks 120 using wired and/or wireless communication capabilities. In operation, the electronic client device 110 may include a graphical user interface (GUI) that renders an interactive layout, schematic, or other elements for the client/user to input a request. For example, the user interface may include a text-based interface allowing the user to enter manual commands. In some embodiments, the electronic client device 110 may run a floorplan map application or program provided by the analytic server 130. A user (operating the electronic client device 110) may issue a search request by typing a room number or a room type in the text-based interface. In another example, the user may click on a certain room in the floorplan map rendered in the GUI and request the analytic server 130 to provide the room information. The GUI may also include a side menu bar giving the user access to a help screen and a button for submitting feedback. The GUI may include any other components to help users better utilize, search, and edit the floorplan map.

The analytic server 130 may be any computing device comprising a processor and other computing hardware and software components, configured to process the requests received from the electronic client device 110. The analytic server 130 may be logically and physically organized within the same or different devices or structures, and may be distributed across any number of physical structures and locations (e.g., cabinets, rooms, buildings, and cities). The analytic server 130 may create a floorplan map in SVG format to encapsulate building floorplan and metadata. More specifically, the analytic server 130 may receive building floorplan data from a third party or access the building floorplan data from local database. The building floorplan data may comprise metadata describing the location, size, type, number, name of each room included in the building floor and any other relevant information regarding the layout and the architecture of the building floor. After the analytic server 130 receives the building floor data, the analytic server 130 may create a SVG floorplan map that may include a SVG graphic map and an associated SVG specification file. The SVG graphic may act as the GUI map that may render each of the rooms, areas, and other entities to a graphical element based on their metadata. The associated specification may include the detailed metadata describing each graphical element (e.g., size, type, number, name, and the like of each room). The analytic server may save the building floorplan data and the specification file of the SVG floorplan map into a floorplan database 130*a*.

The floorplan database 130*a* may be any non-transitory machine-readable media configured to store metadata of the building floorplan, including the original building floorplan data used to create the SVG floorplan map and the specification associated with the created SVG graphic map. The original building floorplan data may be raw data from a third party (e.g., building architect). The analytic server 130*a* may extract the metadata from the original building floorplan data to create the SVG floorplan map and the associated specification. The specification may be a text file including description of each graphical element of the SVG graphic map. The specification may be accessible to any software that loads the SVG image. An SVG editor (e.g., open source "Inkscape") may create an SVG graphic, and edit the description of each component/element of the image.

Each graphical element of the graphic map may represent a room or any other entity/feature of the building floor and correspond to an object in the specification file. The description of each graphical element in the specification may include an element object identifier, detailed metadata description of the element (e.g., size, type, number, name, and other relevant information), and event handlers. The event handlers may be functions defining the operation/actions in response to different events (e.g., clicking, searching, editing) in the SVG graphic map. For example, when a user clicks on a certain graphical element (e.g., a room), the operations defined in the event handler may be to return and display the metadata of the graphical element, such as the room number, room name, room type on the GUI of the electronic client device 110. As a result, the user may easily learn the room information in an interactive manner. Because the specification may be able to include as much information as needed, unlike the static forms of map (e.g., wall posters) that can only include limited information about various entities/features in the map diagram, embodiments described herein may provide any necessary information on any entity/feature in an interactive way.

The analytic server 130 may generate a GUI including the SVG graphic map with each graphical element as an interactive interface. The user operating the electronic client device 110 may issue a request by clicking on any of the graphical elements. Upon receiving such a request, the SVG program provided by the analytic server 130 may automatically detect the mouse-clicking event and determine the object identifier of the clicked graphical element by calling the built-in SVG viewing functionality. The analytic server 130 may further retrieve the specification based on the object identifier to receive the metadata about the clicked graphical element. The analytic server 130 may generate a user interface including the metadata and display the user interface on the electronic client device 110 alongside the clicked graphical element or in any other part of the graphic map (e.g., the upper right corner of the graphic map). In some other embodiments, the analytic server 130 may receive a modification request from the electronic client device 110. For example, the user may select a graphical element and edit the graphical element by dragging the graphical element to a different size. The analytic server 130 may determine the object identifier of the modified graphical element and the new metadata of the object/graphical element after modification (e.g., new size, new location). The analytic server 130 may update the specification of the corresponding graphical element with the new metadata. In operation, the specification and the graphic map may act interactively. For example, any change on the graphic map may trigger the update of the corresponding graphical element metadata in specification. Any update of the specification metadata may trigger the rendering of the corresponding graphical element to reflect the update.

Figure 2:
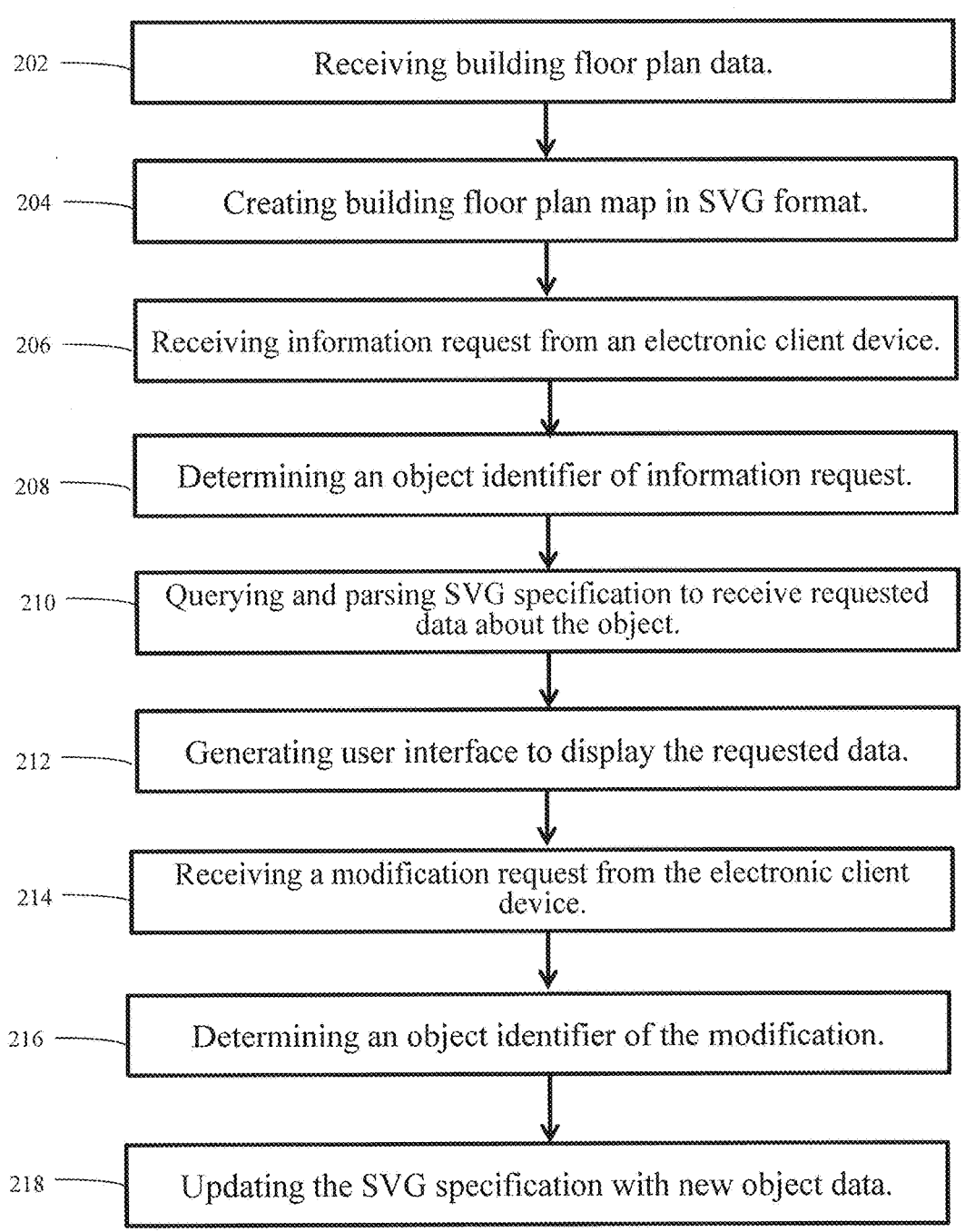
FIG. 2 illustrates a flowchart depicting operational steps for using SVG format to encapsulate building floorplan and metadata, according to an embodiment.

FIG. 2 illustrates execution of a method 200 for using SVG format to encapsulate building floorplan and metadata, according to an embodiment. Other embodiments may comprise additional or alternative steps, or may omit some steps altogether.

At step 202, the analytic server may receive building floorplan data. As discussed above, the building floorplan data may be metadata describing the location, size, type, number, name of each room or any other entity included in the building floor and any other relevant information regarding the layout and the architecture of the building floor. The analytic server may receive such building floorplan data from a third party (e.g., building developer, architect), or have it stored in a local database and access the data from the database. The original floorplan data may be raw data in different formats (image, text, spreadsheet, diagram, and the like) and from different parties.

At step 204, the analytic server may create the building floorplan map in SVG format. The analytic server may aggregate the raw floorplan data, and extract the metadata for each entity included in the floorplan to create a floorplan map in SVG format.

SVG is an Extensible Markup Language (XML) based vector image format for two-dimensional graphics with support for interactivity and animation. The XML text files may define SVG images and functions in response to different events (e.g., clicking, editing) on each element of the SVG images. As a result, a user can search, index, script, and compress the files. As XML files, a user can create and edit SVG images with any text editor, as well as with drawing software. SVG drawings can be dynamic and interactive. Time-based modifications to the elements can be described in synchronized multimedia integration language (SMIL, which is an XML markup language to describe multimedia presentations), or can be programmed in a scripting language (e.g., ECMAScript or JavaScript). A rich set of event handlers such as "onmouseover" and "onclick" may be associated with any SVG graphical object.

The analytic server may create a floorplan map in SVG format that includes both a graphic map and a specification in XML format. The XML specification may include the detailed metadata for each graphical element, and define the event handler for events on the graphical element. The graphic map may include all the graphical elements rendered based on the XML specification file. Thus, the floorplan map in SVG format may comprise two components that interact with each other: the graphical element/representation of each room/entity in the graphic map and the metadata of each room/entity in the specification. In some embodiments, the graphical elements and the metadata may be stored in one file. In some other embodiments, the graphical representations and the metadata may be stored in separate files.

In some embodiments, the analytic server may create a SVG file for the floorplan of each floor. Alternatively, the analytic server may combine the SVG files for different floors and create a large SVG file as one image for the whole building that includes the different floors.

At step 206, the analytic server may receive an information request from an electronic client device querying related information. In some embodiments, the user may interact with one of the graphical elements (e.g., a room) by clicking on the graphical element to query related information about the room. In some other embodiments, the user may type one or more key words in a text-based interface to search/query information related with the key words. For example, the user may look for meeting rooms by searching the key work "meeting," and click on a button "search." The user may interact with the graphic map in any other ways the SVG map supports. The analytic server may capture the events of these requests through the event handlers associated with the graphical elements and other objects such as the buttons, menus, and the like. The analytic server may further call the function defined in the event handlers to respond to the request.

At step 208, the analytic server may determine the object identifier of the information request. The specification may associate each graphical element in the graphic map with an object identifier, and define the event handlers and other metadata corresponding to the graphical element under the same object identifier. In operation, whenever the user triggers an event on the graphic map, the analytic server may determine the object identifier of the graphical element the user interacted. Based on the object identifier, the analytic server may take appropriate actions such as the behaviors defined in the object's event handler to respond to the request.

At step 210, the analytic server may query and parse SVG specification to retrieve the requested data about the object. When the user is requesting metadata of a graphical element, after determining the object identifier, the analytic server may be able to extract the metadata corresponding to the object identifier from the specification by retrieving and parsing the specification. When the user is requesting information related with one or more key words, the analytic server may retrieve and parse the specification based on the key words and determine objects whose metadata matching the one or more key words. Because the specification text file is in XML format, the analytic server may be able to search, index, and script the specification. As a result, the analytic server may be able to dynamically provide the requested data to the user in an interactive manner.

At step 212, the analytic server may generate a user interface to display the requested data. The analytic server may modify the event handler function in the XML specification to render a user interface that includes the requested data. For example, the analytic server may generate a window or a text box displaying the data related to a clicked graphical element (e.g., room number, room size, room type, and room location). In some other embodiments, the analytic server may highlight the graphical elements requested by the user. For example, when a user is looking for meeting rooms by issuing a search request, the analytic server may retrieve the specification based on the key word "meeting" and determine objects whose metadata matching the one or more key words. The analytic server may return the searching results by highlighting all the graphical elements of the rooms/entities with the room type "meeting." Comparing to the static map, the interactivity provided by the SVG map may dynamically respond to the users' request with more accurate and specific information, thus improve the user experience.

At step 214, the analytic server may receive a modification request from the electronic client device. In some embodiments, the user may issue a modification request by interacting with the GUI graphic map. For example, the user may modify the graphic map by dragging and dropping edges of one or more graphical elements to resize or reshape the graphical elements. Alternatively, the user may drag and drop the graphical elements into a different position. The user may modify/edit the graphic map in any other ways the SVG map supports. The analytic server may keep monitoring the modification operation, and determine new metadata of the modified object, including the new size or new shape after the dragging of the graphical element edges, the new location and new layout after the moving of one or more graphical elements, and other related changes. Because the SVG program manages all the graphical elements as objects, all the modifications and changes may be associated with the object identifier of the corresponding graphical elements.

At step 216, the analytic server may determine the object identifier of the modification. The analytic server may detect the events happened on the one or more graphical elements and determine the corresponding object identifiers of the modified graphical elements. Specifically, the analytic server may define the event handlers under each object identifier of the corresponding graphical element. Any event occurred on any of the graphical elements may automatically trigger the event handlers defined for the corresponding object identifier.

At step 218, the analytic server may update the SVG specification with new object data. As discussed above, the SVG graphic map and the SVG specification act interactively and synchronously. The specification may automatically reflect any modifications/changes in the graphic map in real time, and vice versa. For example, the analytic server may identify the description of the modified object in the specification based on the object identifier, and update the description with the new data (e.g., new size, new location). In some embodiments, the modification of the SVG map may happen directly in the specification, instead of in the graphic map. For example, the user may open the SVG specification in a text editor and change the description (e.g., metadata) of the elements the user needs to modify. The SVG program in the analytic server may automatically render the graphical elements according to the new description/metadata.

By using the SVG format to encapsulate the building floorplan and metadata, the visual representation of the element and the metadata of the element may be interactive, and act as one file in SVG images. As a result, the modification on the image may be more convenient and efficient comparing to the traditional methods. In traditional methods, the visual representation of the map and metadata file are two separate files with no interactivity, where the metadata file includes coordinates of each of the locations of the rooms (e.g., in x/y/width/height) along with the room number for those coordinates. In traditional methods, when a modification happens, the user may have to go to two different files to make the changes and keep them synchronized with each other, which could be inefficient and prone to error. Especially when a user resizes or zooms in/out an image, the traditional methods may need to scale the coordinates to match the new size. For example, the traditional methods may need to determine the coordinates of the clicks, and transform the coordinates to determine on which room the user has clicks or otherwise interacted. When the image is magnified (e.g., zoomed in/out), the same coordinates may map to a different zoom. The traditional methods may have to transform the coordinates and do geometry calculation. However, in SVG images, the SVG program manages the elements as objects; thus, the click may be associated with an object no matter what size the object is.

Figure 3:
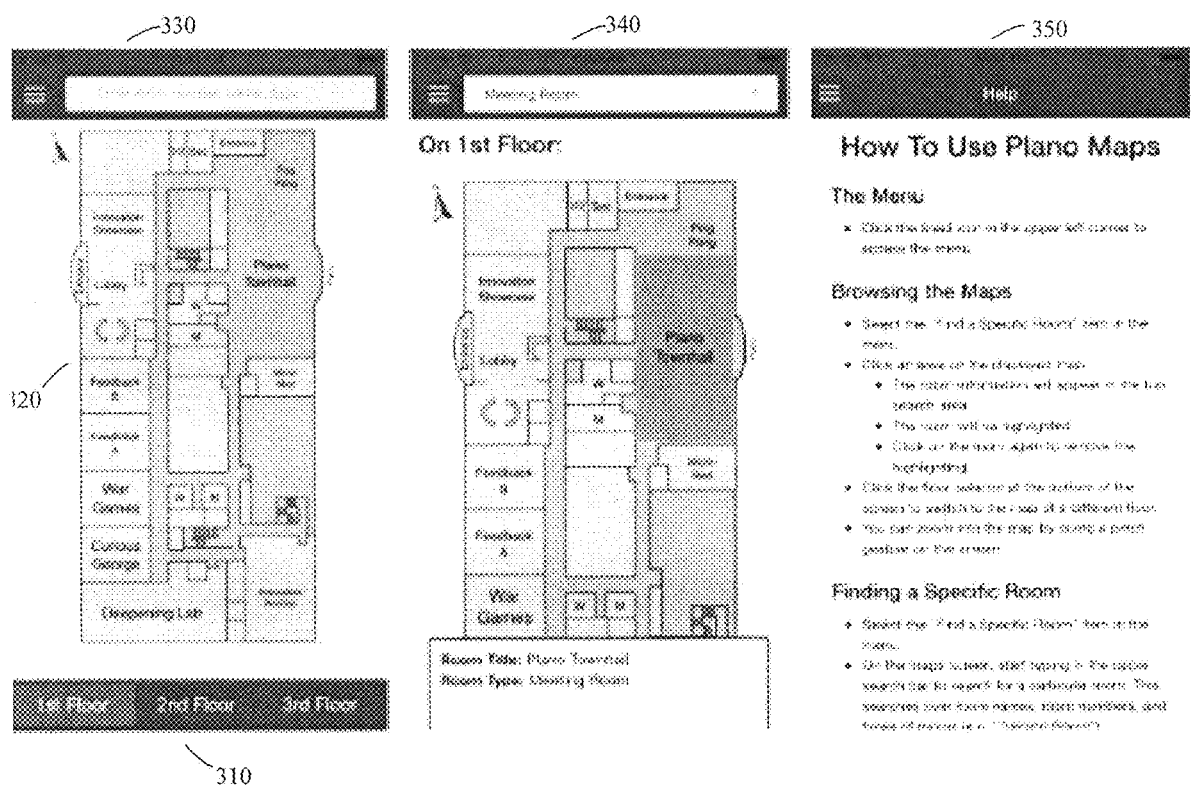
FIG. 3 illustrates an example of graphical user interface of the SVG floorplan map, according to an embodiment.

FIG. 3 illustrates an example of graphical user interface of the SVG floorplan map, according to an embodiment. The GUI of the SVG floorplan map may include a menu 310 providing options for the user to select a floor. Assuming the user selects first floor, the GUI may display the graphic floorplan map 320 of the 1st floor. The graphic map may include the graphical elements of each entity (e.g., room, lobby, and lab) with each graphical element corresponding to an object. When the user clicks on any of the graphical elements, the event handlers associated with the object may trigger the appropriate functionalities (e.g., displaying the related information regarding the clicked graphical element). The GUI may also include a text-based user interface 330 for the user to type searching key words. For example, the user may be able to enter room number, name, and type in the search bar user interface 330. The analytic server may retrieve the key words in the SVG specification and return the matching room results by highlighting the matching graphical elements of the rooms. When the user clicks on one of the highlighted rooms, the analytic server may generate a user interface that includes the detailed metadata of the room. In some embodiments, the analytic server may display the most recently chosen search results when the user clicks on the search bar 330 to make it easy for the user to find a recently selected room again. The GUI may also include a drop down menu 340 with different room type options. The user may be able to select a room type in the drop down menu to search for the rooms in the selected type. Furthermore, the GUI may include a side menu bar 350 that gives the user access to a help screen and a button (not shown) for submitting feedbacks.

Figure 4A:
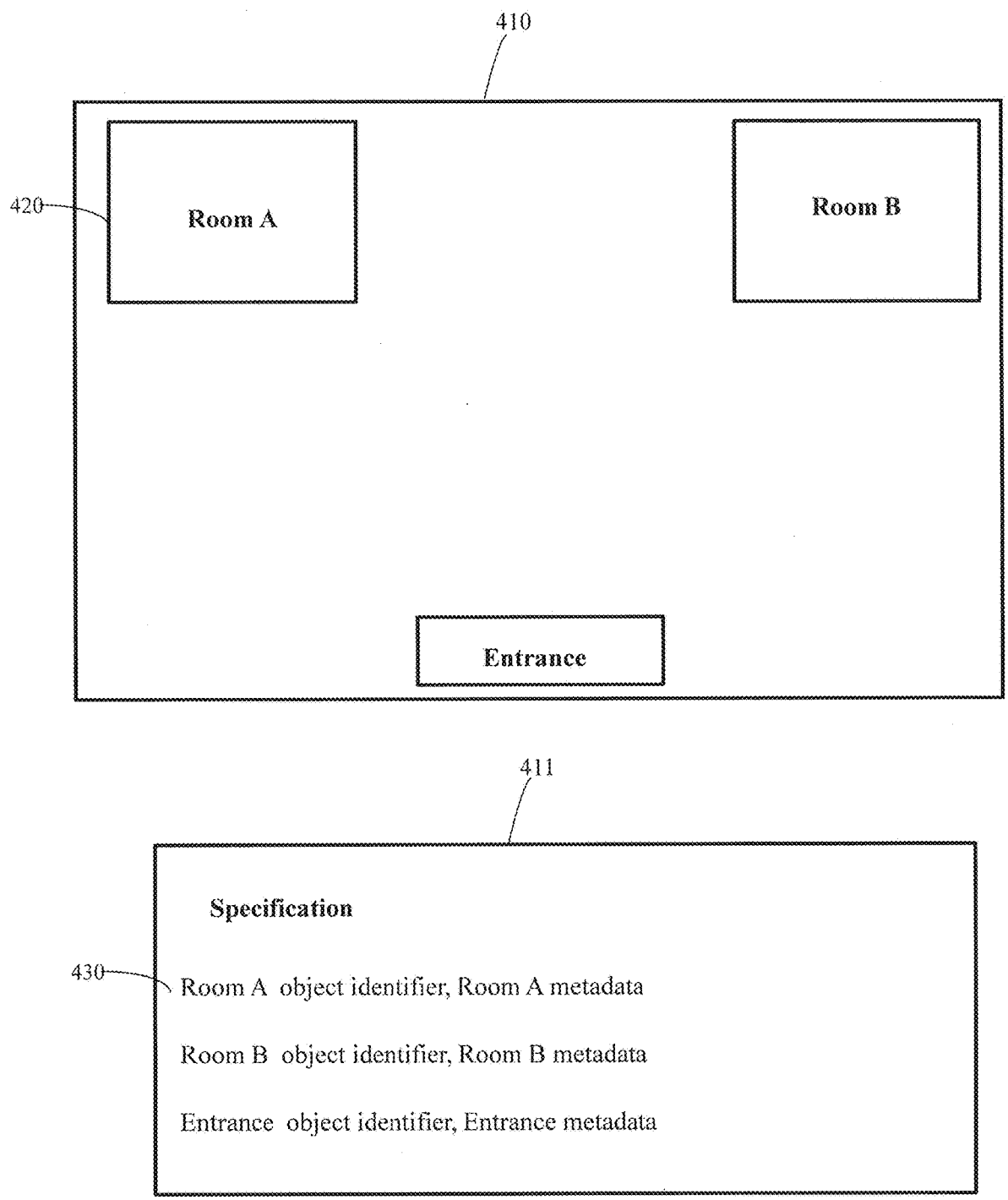
FIGS. 4A-4B illustrate an example of modifying SVG floorplan map, according to an embodiment.
Figure 4B:
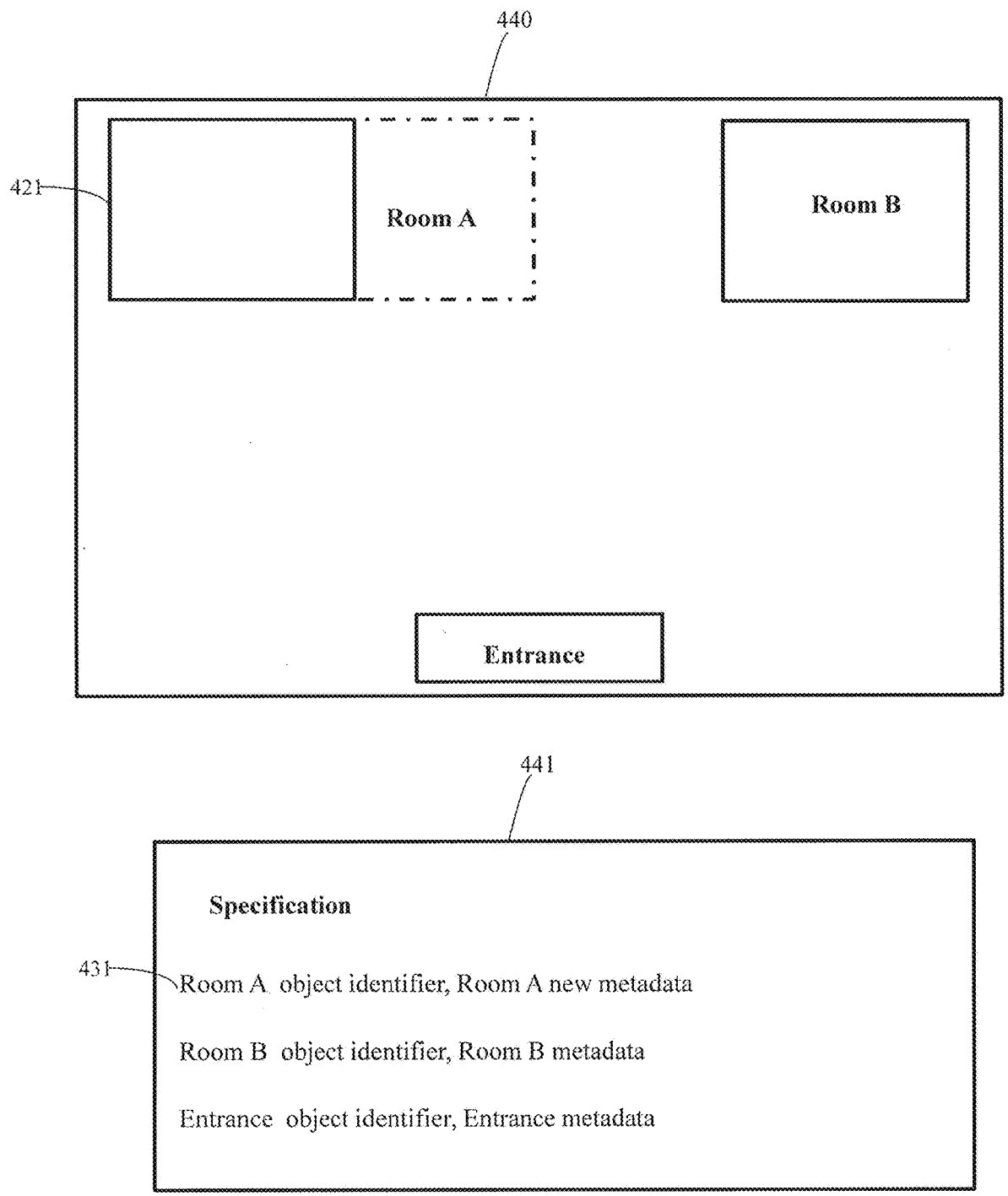

FIGS. 4A-4B illustrate an example of modifying SVG floorplan map, according to an embodiment. FIG. 4A illustrates the example of SVG floorplan map before the modification. As discussed above, the SVG floorplan map may comprise a graphic map 410 and a specification file 411. The graphic map 410 may include graphical elements corresponding to different entities, such as Room A, Room B, and Entrance. The specification file 411 may include the object identifier and the metadata corresponding to each entity. For example, for the entity of Room A, the graphic map 410 may include a graphical element 420, the specification file 411 may include a record 430. When a user modifies the entity of Room A (as illustrated by the dashed portion of Room A), the user may redraw the graphical element 420 in an image editor to a larger size. FIG. 4B illustrates the example of SVG floorplan after the modification. As shown, the graphical element 421 in the graphic map 440 has a larger size. The corresponding record 431 in the specification file 441 may reflect the modification by automatically updating the record with new metadata (e.g., new size, new shape, and new layout) of the graphical element 421 in real time. In another embodiment, the user may modify the metadata corresponding to Room A in the specification file. For example, the user may change the record 430 into record 431. The graphic map may automatically reflect the change. In other words, the analytic server may change the graphical element 420 to graphical element 421 in real time. Because the SVG graphic map and the SVG specification act interactively and synchronously, any modifications/changes in the graphic map may trigger changes in the specification in real time, and vice versa.

EXAMPLE

In a non-limiting example, the analytic server may display a floorplan map on a graphical user interface. The floorplan map may be in SVG format and comprise a graphic map and a specification file. For instance, the analytics server may utilize these files to render the floorplan. The graphic map may include graphical elements corresponding to different rooms and other entities/features on the floor. The specification file may include one or more object identifiers corresponding to each graphical element. The specification file may also define the metadata and functions under the object identifier for the corresponding graphical element. The graphic map and the specification file may act interactively and synchronously. A user may issue a request (e.g., a modification request) by interacting with a graphical element rendered on the user interface. For example, the user may modify (e.g., resize or zoom in/out) a graphical element of a room by dragging and dropping the graphical element.

The analytic server may identify the object identifier of the modified graphical element and determine the new metadata (e.g., new size, new shape, and new layout) of the graphical element. The analytic server may also automatically trigger an event handler of a modification function and update the metadata of the object identifier with the new metadata in real time. As a result, the specification file may reflect the changes/modifications of the graphical element synchronously. In this way, the analytics server ensure a more efficient modification of the floorplan rendered in SVG format.

In another non-limiting example, the user may query information regarding a graphical element by clicking on the graphical element. The analytic server may identify the object identifier of the clicked graphical element and retrieve the metadata associated with the graphical element from the specification file based on the object identifier. The analytic server may update the user interface to display the metadata associated with the graphical element.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
  rendering, by a server on a user interface displayed on an electronic client device, a floorplan map in scalable vector graphics format, wherein the floorplan map in scalable vector graphics format comprises a graphic map and a specification file, the graphic map containing a plurality of graphical elements and the specification file containing a plurality of objects corresponding to the plurality of graphical elements along with metadata and functions associated with each graphical element;
  rendering, by the server on the user interface, a text-based user input section configured to receive a key word entered by a user via the electronic client device;
  identifying, by the server, the key word entered by the user via the electronic client device;
  identifying, by the server and based on the key word, a first object of the plurality of objects in the specification file;
  determining an association between the first object and a first graphical element of the plurality of graphical elements;
  highlighting the first graphical element in the graphic map, and after highlighting the first graphical element:
    identifying, by the server, an interaction from the user with the first graphical element, the interaction corresponding to a request to modify the first graphical element, wherein the request comprises new metadata corresponding to at least one of a new size, a new shape, a new location, and a new layout of the first graphical element;
    identifying, by the server and within the specification file, an object identifier corresponding to the first graphical element and the first object; and
    updating, by the server in real time, metadata associated with the object identifier with the new metadata in the specification file, wherein the server updates the metadata associated with the object identifier by triggering a modification function in scripting language associated with the object identifier, the modification function corresponding to the request to modify the first graphical element.

2. The method of claim 1, further comprising:
  receiving, by the server, an information request on the first graphical element of the graphic map, wherein the user issues the information request is issued based on an interaction with the first graphical element;
  retrieving and parsing, by the server and based on the information request, the specification file to receive metadata associated with the graphical element based on the object identifier; and
  updating, by the server, the user interface to display the metadata associated with the first graphical element.

3. The method of claim 1, wherein the plurality of graphical elements in the graphic map is rendered based on the specification file.

4. The method of claim 1, wherein the specification file is in extensible markup language (XML) format.

5. The method of claim 1, wherein the metadata associated with the object identifier comprises information on size, number, type, and location of the first graphical element of the plurality of graphical elements in the floorplan map.

6. The method of claim 1, wherein the graphic map and the specification file act interactively.

7. The method of claim 1, further comprising:
modifying, by the server, the specification file to make changes in the graphic map.

8. The method of claim 1, wherein the user issues the request to modify the first graphical element by dragging and dropping the first graphical element on the user interface.

9. The method of claim 1, wherein the scripting language comprises ECMAScript.

10. The method of claim 1, wherein the scripting language comprises JavaScript.

11. A system comprising:
an electronic client device; and
a server in communication with the electronic client device and configured to:
　render, on a user interface displayed on the electronic client device, a floorplan map in scalable vector graphics format, wherein the floorplan map in scalable vector graphics format comprises a graphic map and a specification file, the graphic map containing a plurality of graphical elements, and the specification file containing a plurality of objects corresponding to the plurality of graphical elements along with metadata and functions associated with each graphical element of the plurality of graphical elements;
　render, on the user interface, a text-based user input section configured to receive a key word entered by a user via the electronic client device;
　identify the key word entered by the user via the electronic client device;
　identify, based on the key word, a first object of the plurality of objects in the specification file;
　determine an association between the first object and a first graphical element of the plurality of graphical elements;
　highlight the first graphical element in the graphic map;
　identify an interaction from a user of the electronic client device with the first graphical element, the interaction corresponding to a request to modify the first graphical element, wherein the request comprises new metadata corresponding to at least one of a new size, a new shape, a new location, and a new layout of the first graphical element;
　identify, within the specification file, an object identifier corresponding to the first graphical element and the first object; and
　update, in real time, metadata associated with the object identifier with the new metadata in the specification file, wherein the server updates the metadata by triggering a modification function in scripting language associated with the object identifier, the modification function corresponding to the request to modify the first graphical element.

12. The system of claim 11, wherein the server is further configured to:
　receive an information request on the first graphical element of the graphic map, wherein the user issues the information request by interacting with the graphical element via the electronic client device;
　retrieve and parse the specification file to receive metadata associated with the first graphical element based on the object identifier; and
　update the user interface to display the metadata associated with the first graphical element.

13. The system of claim 11, wherein the plurality of graphical elements in the graphic map is rendered based on the specification file.

14. The system of claim 11, wherein the specification file is in extensible markup language (XML) format.

15. The system of claim 11, wherein the metadata comprises information on size, number, type, location of the plurality of graphical elements in the floorplan map.

16. The system of claim 11, wherein the graphic map and the specification file act interactively.

17. The system of claim 11, wherein the specification file associates the first graphical element in the graphic map with the object identifier, and define the metadata associated with the object identifier and functions corresponding to the first graphical element under the object identifier.

18. The system of claim 11, wherein the server is further configured to: modify the specification file to make changes in the graphic map.

19. The system of claim 11, wherein the server is configured to modify the first graphical element based on dragging and dropping the first graphical element on the user interface.

20. The system of claim 11, wherein the scripting language comprises ECMAScript or JavaScript.

* * * * *